United States Patent

Nakamura et al.

[11] Patent Number: 5,880,486
[45] Date of Patent: *Mar. 9, 1999

[54] LIGHT-EMITTING GALLIUM NITRIDE-BASED COMPOUND SEMICONDUCTOR DEVICE

[75] Inventors: Shuji Nakamura; Takashi Mukai; Naruhito Iwasa, all of Anan, Japan

[73] Assignee: Nichia Chemical Industries, Ltd., Japan

[ * ] Notice: The term of this patent shall not extend beyond the expiration date of Pat. No. 5,578,839.

[21] Appl. No.: 705,972

[22] Filed: Aug. 30, 1996

Related U.S. Application Data

[62] Division of Ser. No. 153,153, Nov. 17, 1993, Pat. No. 5,578,839.

[30] Foreign Application Priority Data

| Nov. 20, 1992 | [JP] | Japan | 4-335556 |
| Jan. 8, 1993 | [JP] | Japan | 5-18122 |
| Jan. 8, 1993 | [JP] | Japan | 5-18123 |
| Mar. 5, 1993 | [JP] | Japan | 5-70873 |
| Mar. 5, 1993 | [JP] | Japan | 5-70874 |
| May 17, 1993 | [JP] | Japan | 5-114542 |
| May 17, 1993 | [JP] | Japan | 5-114543 |
| May 17, 1993 | [JP] | Japan | 5-114544 |

[51] Int. Cl.$^6$ .................................. H01L 33/00
[52] U.S. Cl. ...................... 257/96; 257/101; 257/201; 257/613
[58] Field of Search ................. 257/79, 94, 96, 257/101, 102, 103, 201, 609, 613, 615

[56] References Cited

U.S. PATENT DOCUMENTS

| 5,237,182 | 8/1993 | Kitagawa et al. | 257/15 |
| 5,323,027 | 6/1994 | Yamada et al. | 257/96 |
| 5,578,839 | 11/1996 | Nakamura et al. | 257/96 |

FOREIGN PATENT DOCUMENTS

| 0 496 030 A2 | 7/1992 | European Pat. Off. . |
| 64-17484 | 1/1989 | Japan . |
| 2-229475 | 9/1990 | Japan . |
| 4-209577 | 7/1992 | Japan . |
| 4-236478 | 8/1992 | Japan . |

OTHER PUBLICATIONS

Nakamura et al. "High–quality InGan Films Grown on GaN Films" Japanese Journal of Applied Physics, vol. 31, No. 10B, Oct. 15, 1992, Tokyo, Japan, pp. L1457–L1459.

Patent Abstracts of Japan, vol. 15 No. 470 (E–1139) Nov. 28, 1991 & JP–A–03 203 388 (Matsushita Electric Ind Co Ltd Sep. 5, 1991 (abstract).

Nakamura et al. "High–Power InGaN/GaN . . . " Applied Physics Letters, vol. 62, No. 19, May 10, 1993, New York, US, pp. 2390–2392 and p. 2390, col. 1, line 1—column 2 line 21.

*Primary Examiner*—Mark V. Prenty
*Attorney, Agent, or Firm*—Nixon & Vanderhye

[57] ABSTRACT

A light-emitting gallium nitride-based compound semiconductor device of a double-heterostructure. The double-heterostructure includes a light-emitting layer formed of a low-resistivity $In_xGa_{1-x}N$ (0<x<1) compound semiconductor doped with p-type and/or n-type impurity. A first clad layer is joined to one surface of the light-emitting layer and formed of an n-type gallium nitride-based compound semiconductor having a composition different from the light-emitting layer. A second clad layer is joined to another surface of the light-emitting layer and formed of a low-resistivity, p-type gallium nitride-based compound semiconductor having a composition different from the light-emitting layer.

8 Claims, 6 Drawing Sheets

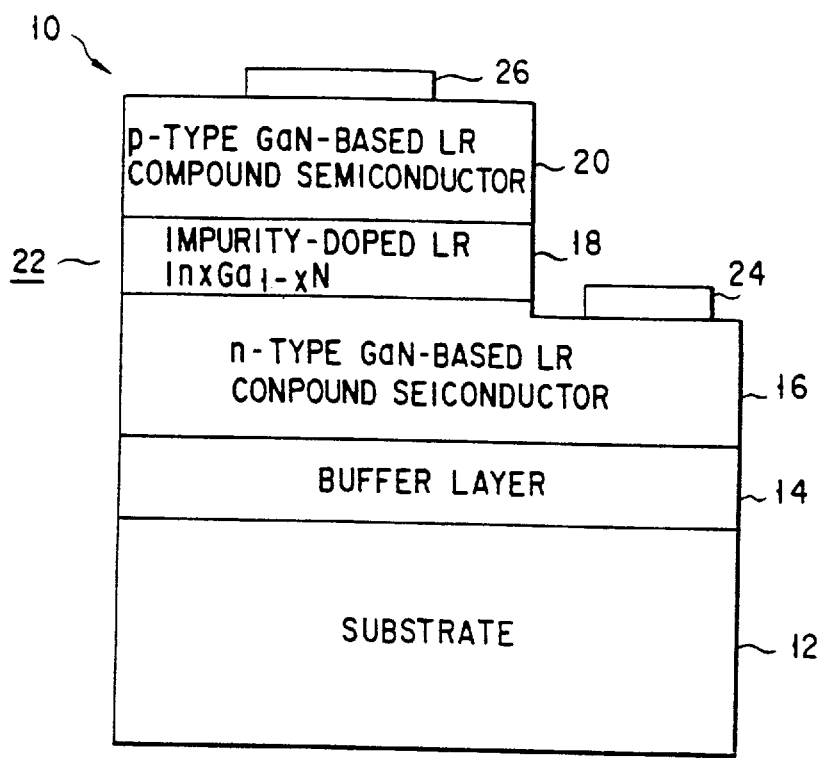
F I G. 1
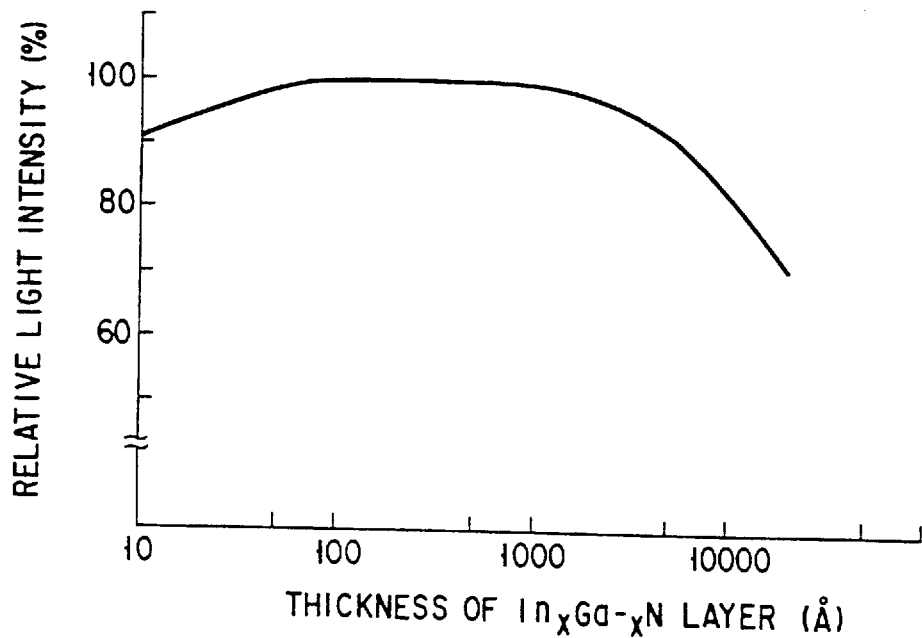
F I G. 2

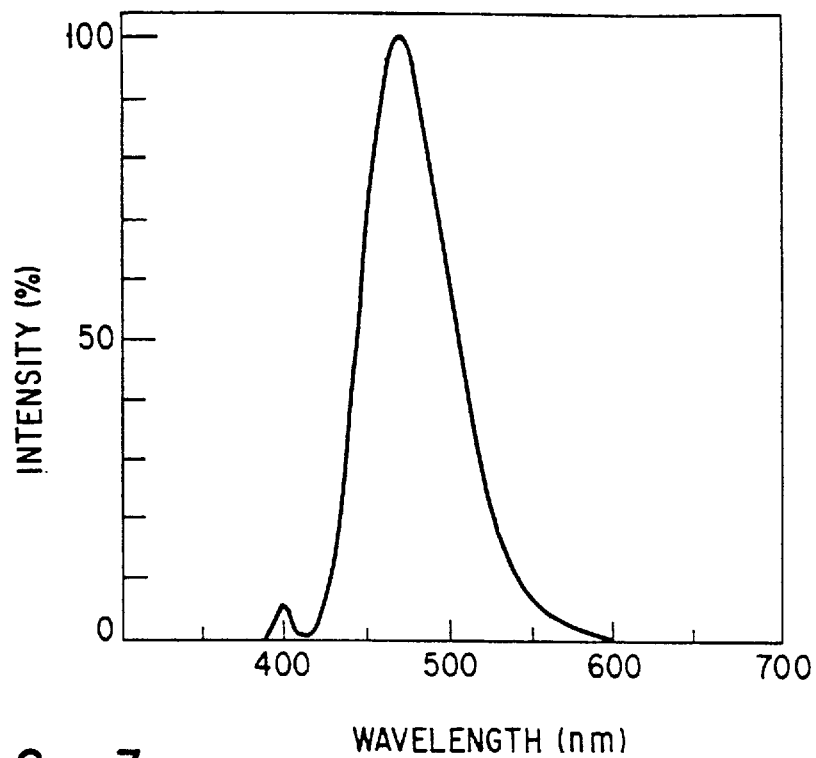
F I G. 3
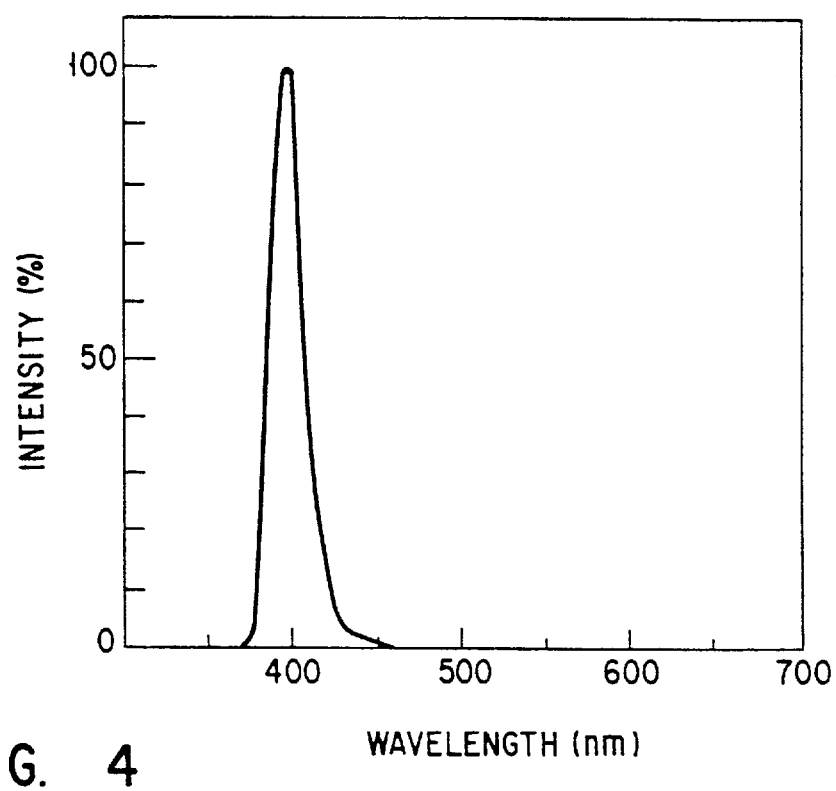
F I G. 4

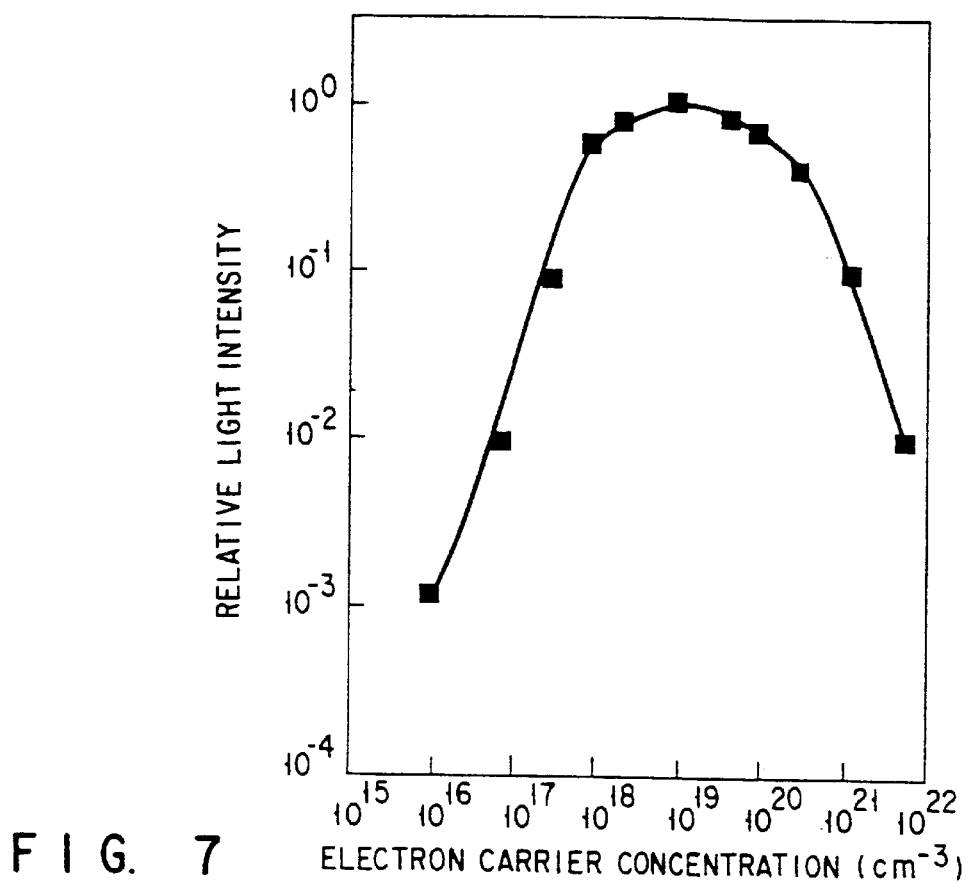
FIG. 7
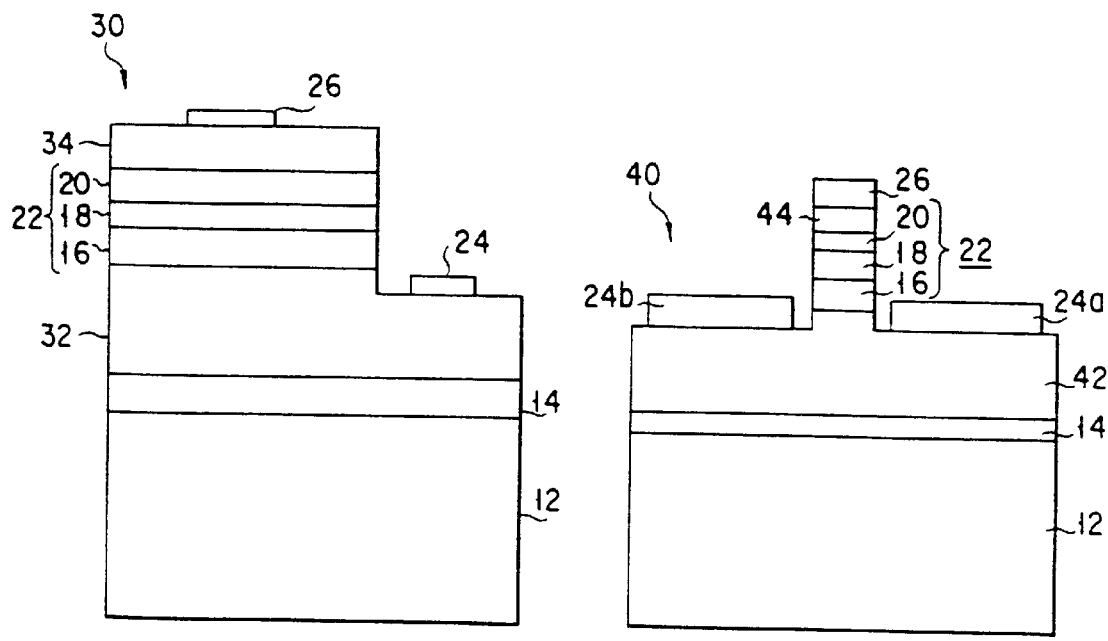
FIG. 11
FIG. 12

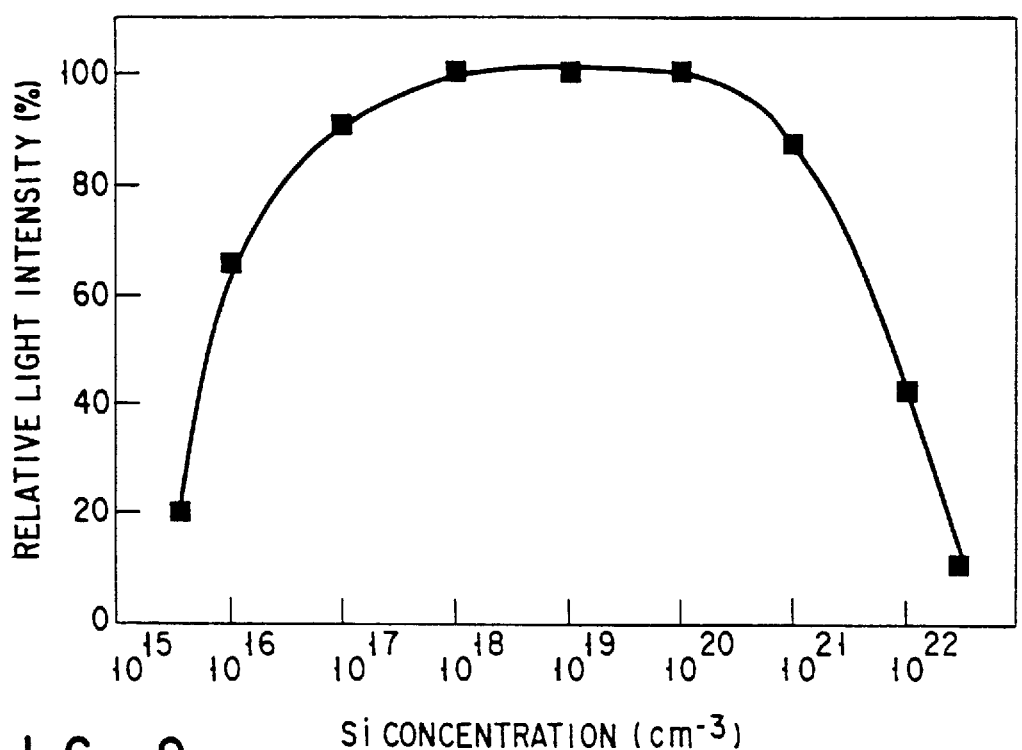
F I G. 9
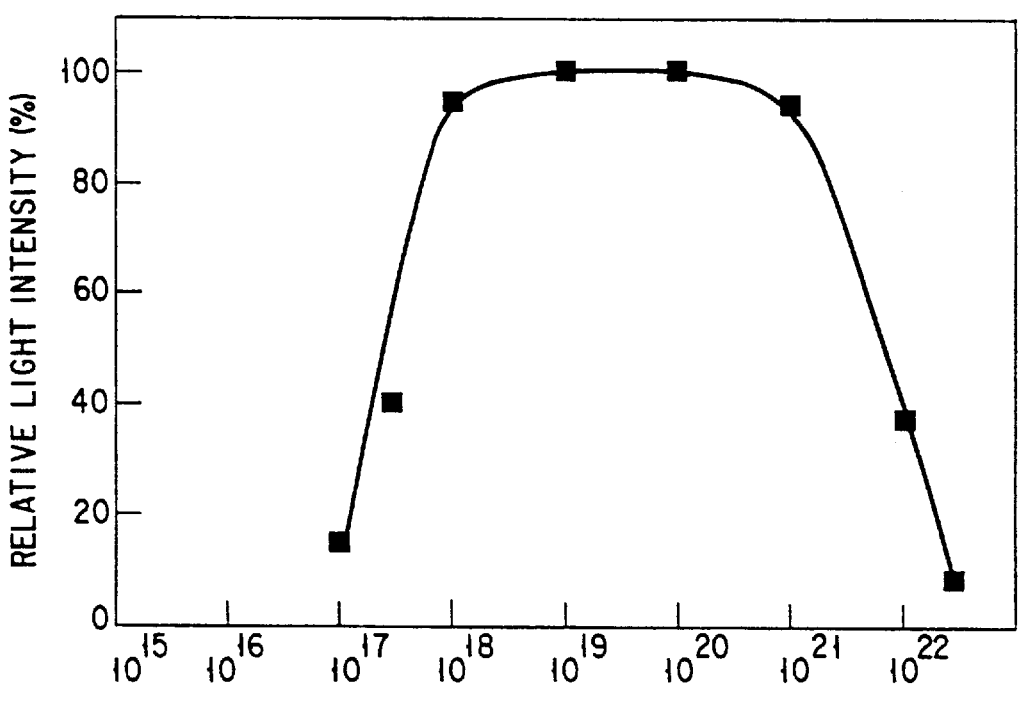
F I G. 10

LIGHT-EMITTING GALLIUM NITRIDE-BASED COMPOUND SEMICONDUCTOR DEVICE

This is a division of application Ser. No. 08/153,153, filed 17 Nov. 1993 and now U.S. Pat. No. 5,578,839.

BACKGROUND OF THE INVENTION

1. Field of the Invention

The present invention relates to a light-emitting gallium nitride-based compound semiconductor device and, more particularly, to a light-emitting compound semiconductor device having a double-heterostructure capable of emitting high-power visible light ranging from near-ultraviolet to red, as desired, by changing the composition of a compound semiconductor constituting an active layer (light-emitting layer).

2. Description of the Related Art

Gallium nitride-based compound semiconductors such as gallium nitride (GaN), gallium aluminum nitride (GaAlN), indium gallium nitride (InGaN), and indium aluminum gallium nitride (InAlGaN) have a direct band gap, and their band gaps change in the range of 1.95 eV to 6 eV. For this reason, these compound semiconductors are promising as materials for light-emitting devices such as a light-emitting diode and a laser diode.

For example, as a light-emitting device using a gallium nitride semiconductor, a blue light-emitting device in which a homojunction structure is formed on a substrate normally made of sapphire through an AlN buffer layer has been proposed. The homojunction structure includes a light-emitting layer formed of p-type impurity-doped GaN on an n-type GaN layer. As the p-type impurity doped in the light-emitting layer, magnesium or zinc is normally used. However, even when the p-type impurity is doped, the GaN crystal has a poor quality, and remains an i-type crystal having a high resistivity almost close to an insulator. That is, the conventional light-emitting device is substantially of a MIS structure. As a light-emitting device having the MIS structure, layered structures in which Si- and Zn-doped, i-type GaAlN layers (light-emitting layers) are formed on n-type CaAlN layers are disclosed in Jpn. Pat. Appln. KOKAI Publication Nos. 4-10665, 4-10666, and 4-10667.

However, in the light-emitting device having the MIS structure, both luminance and light-emitting output power are too low to be practical.

In addition, the light-emitting device of a homojunction is impractical because of the low power output by its nature. To obtain a practical light-emitting device having a large output power, it is required to realize a light-emitting device of a single-heterostructure, and more preferably, a double-heterostructure.

However, no light-emitting semiconductor devices of a double-heterostructure are known, in which the double-heterostructure is entirely formed of low-resistivity gallium nitride-based compound semiconductors, and at the same time, has a light-emitting layer consisting of low-resistivity, impurity-doped InGaN.

Jpn. Pat. Appln. KOKAI Publication Nos. 4-209577, 4-236477, and 4-236478 disclose a light-emitting device having a double-heterostructure in which an InGaN light-emitting layer is sandwiched between an n-type InGaAlN clad layer and a p-type InGaAlN clad layer. However, the light-emitting layer is not doped with an impurity, and it is not disclosed or explicitly suggested that an impurity is doped into the light-emitting layer. In addition, the p-type clad layer is a high-resistivity layer in fact. A similar structure is disclosed in Jpn. Pat. Appln. KOKAI Publication No. 64-17484.

Jpn. Pat. Appln. KOKAI Publication 4-213878 discloses a structure in which an undoped InGaAlN light-emitting layer is formed on an electrically conductive ZnO substrate, and a high-resistivity InGaN layer is formed thereon.

Jpn. Pat. Appln. KOKAI Publication No. 4-68579 discloses a double-heterostructure having a p-type GaInN clad layer formed on an oxygen-doped, n-type GaInN light-emitting layer. However, another clad layer consists of electrically conductive ZnO. The oxygen is doped in the light-emitting layer to be lattice-matched with the ZnO. The emission wavelength of the light-emitting device having this double-heterostructure is 365 to 406 nm.

All conventional light-emitting devices are unsatisfactory in both output power and luminance, and have no satisfactory luminosity.

SUMMARY OF THE INVENTION

It is an object of the present invention to provide a double-heterostructure in which all of the light-emitting layer (active layer) and the clad layers are formed of low-resistivity gallium nitride-based III-V Group compound semiconductors, thereby realizing a semiconductor device exhibiting an improved luminance and/or light-emitting output power.

It is another object of the present invention to provide a light-emitting device excellent in luminosity.

It is still another object of the present invention to provide an ultraviolet to red light-emitting device having a wavelength in the region of 365 to 620 nm.

According to the present invention, there is provided a light-emitting gallium nitride-based compound semiconductor device having a double-heterostructure comprising:

a light-emitting layer (active layer) having first and second major surfaces and formed of a low-resistivity $In_xGa_{1-x}N$ ($0<x<1$) compound semiconductor doped with an impurity;

a first clad layer joined to the first major surface of the light-emitting layer and formed of an n-type gallium nitride-based compound semiconductor having a composition different from that of the compound semiconductor of the light-emitting layer; and a second clad layer joined to the second major surface of the light-emitting layer and formed of a low-resistivity, p-type gallium nitride-based compound semiconductor having a composition different from that of the compound semiconductor of the light-emitting layer.

In the first embodiment, the compound semiconductor of the light-emitting layer (active layer) is of p-type, doped with a p-type impurity.

In the second embodiment, the compound semiconductor of the light-emitting layer (active layer) remains an n-type, doped with at least a p-type impurity.

In the third embodiment, the compound semiconductor of the light-emitting layer (active layer) is of n-type, doped with an n-type impurity.

In the present invention, the compound semiconductor of the first clad layer is preferably represented by the following formula:

$Ga_yAl_{1-y}N$ ($0 \leq y \leq 1$)

The compound semiconductor of the second clad layer is preferably represented by the following formula:

$Ga_zAl_{1-z}N$ ($0 \leq z \leq 1$)

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a view showing a basic structure of a semiconductor light-emitting diode of the present invention;

FIG. 2 is a graph showing a relationship between the light intensity and the thickness of a light-emitting layer in the light-emitting semiconductor device of the present invention;

FIG. 3 shows a photoluminescence spectrum of a low-resistivity, n-type $In_xGa_{1-x}N$ light-emitting layer according to the second embodiment of the present invention;

FIG. 4 shows a photoluminescence spectrum of an undoped $In_xGa_{1-x}N$ light-emitting layer;

FIG. 7 is a graph showing a relationship between an electron carrier concentration in the light-emitting layer and the light emission characteristics in the light-emitting semiconductor device according to the second embodiment of the present invention;

FIG. 9 is a graph showing a relationship between an n-type impurity concentration in a light-emitting layer and the light emission characteristics in a light-emitting semiconductor device according to the third embodiment of the present invention;

FIG. 10 is a graph showing a relationship between a p-type impurity concentration in a p-type clad layer and the light emission characteristics in the light-emitting semiconductor device according to the third embodiment of the present invention;

FIG. 11 shows a structure of still another light-emitting diode according to the present invention; and FIG. 12 is a view showing a structure of a laser diode of the present invention.

DETAILED DESCRIPTION OF THE PREFERRED EMBODIMENTS

Figure 5:
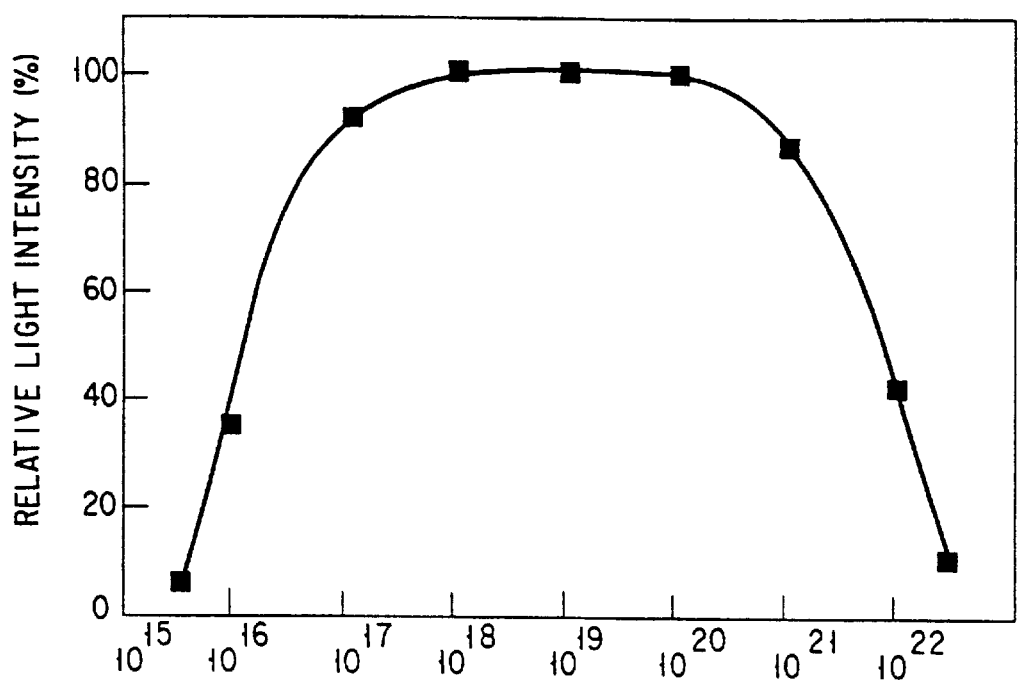
FIG. 5 is a graph showing a relationship between a p-type impurity concentration in the light-emitting layer and the light intensity in the light-emitting semiconductor device according to the second embodiment of the present invention.

The present invention provides a double-heterostructure in which all of the light-emitting layer and clad layers sandwiching the light-emitting layer are formed of low-resistivity gallium nitride-based III-V Group compound semiconductors, and at the same time, the light-emitting layer is formed of an impurity-doped, low-resistivity $In_xGa_{1-x}N$ compound semiconductor, thereby realizing a visible light emitting semiconductor device which is excellent in output power, luminance, and luminosity, for the first time.

The semiconductor device of the present invention includes a light-emitting diode (LED) and a laser diode (LD).

The present invention will be described below in detail with reference to the accompanying drawings. The same reference numerals denote the same parts throughout the drawings.

FIG. 1 shows a basic structure of an LED to which the present invention is applied. As shown in FIG. 1, an LED 10 of the present invention has a double-heterostructure 22 comprising a light-emitting layer (active layer) 18 formed of impurity-doped, low-resistivity (LR) $In_xGa_{1-x}N$, a first clad layer 16 joined to the lower surface (first major surface) of the light-emitting layer 18 and formed of an n-type, low-resistivity GaN-based III-V Group compound semiconductor, and a second clad layer 20 joined to the upper surface (second major surface) of the light-emitting layer 18 and formed of a p-type, low-resistivity GaN-based III-V Group compound semiconductor. $In_xGa_{1-x}N$ of the light-emitting layer 18 is a gallium nitride-based III-V Group compound semiconductor.

Because of the double-heterostructure, the compound semiconductor composition (except for impurities) of the first clad layer 16 is different from that of the light-emitting layer 18. The compound semiconductor composition of the second clad layer 20 is also different from that of the light-emitting layer 18. The compound semiconductor compositions of the clad layers 16 and 20 may be the same or different.

The present inventors have made extensive studies on the light-emitting device having all gallium nitride-based III-V Group compound semiconductor double-heterostructure having high light emission characteristics, and found that, when the light-emitting layer is formed of $In_xGa_{1-x}N$, and the ratio x of indium (In) is changed within the range of 0<x<1, a light-emitting device capable of emitting visible light ranging from near-ultraviolet to red can be obtained. The present inventors have also found that, when an impurity is doped in $In_xGa_{1-x}N$ and $In_xGa_{1-x}N$ has a low resistivity, a light-emitting device having improved light emission characteristics, especially a high output power, a high luminance, and a high luminosity could be obtained.

In the light-emitting device of the present invention, when the value of x in $In_xGa_{1-x}N$ of the light-emitting layer is close to 0, the device emits ultraviolet light. When the value of x increases, the emission falls in the longer-wavelength region. When the value of x is close to 1, the device emits red light. When the value of x is in the range of 0<x<0.5, the light-emitting device of the present invention emits blue to yellow light in the wavelength range of 450 to 550 nm.

In the present invention, an impurity (also called as a dopant) means a p- or n-type impurity, or both of them. In the present invention, the p-type impurity includes Group II elements such as cadmium, zinc, beryllium, magnesium, calcium, strontium, and barium. As the p-type impurity, zinc is especially preferable. The n-type impurity includes Group IV elements such as silicon, germanium and tin, and Group VI elements such as selenium, tellurium and sulfur.

In the present invention, "low-resistivity" means, when referred to a p-type compound semiconductor, that the p-type compound semiconductor has a resistivity of $1 \times 10^5$ $\Omega \cdot cm$ or less, and when referred to an n-type compound semiconductor, that the n-type compound semiconductor has a resistivity of 10 $\Omega \cdot cm$ or less.

Therefore, in the present invention, $In_xGa_{1-x}N$ of the light-emitting layer 18 includes a low-resistivity, p-type $In_xGa_{1-x}N$ doped with a p-type impurity (the first embodiment to be described below in detail), a low-resistivity, n-type $In_xGa_{1-x}N$ doped with at least a p-type impurity (the second embodiment to be described below in detail), or an n-type $In_xGa_{1-x}N$ doped with an n-type impurity (the third embodiment to be described below in detail).

In the present invention, the first clad layer 16 is formed of a low-resistivity n-type gallium nitride-based III-V Group compound semiconductor. Although the n-type gallium nitride-based III-V Group compound semiconductor tends to be of an n-type even when undoped, it is preferable to dope an n-type impurity therein and positively make an n-type compound semiconductor. The compound semiconductor forming the first clad layer 16 is preferably represented by the following formula:

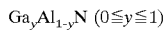
$Ga_yAl_{1-y}N$ $(0 \leq y \leq 1)$

In the present invention, the second clad layer 20 is formed of a low-resistivity, p-type gallium nitride-based III-V Group compound semiconductor doped with a p-type impurity. The compound semiconductor is preferably represented by the following formula:

$Ga_zAl_{1-z}N$ $(0 \leq z \leq 1)$

The first, n-type clad layer 16 normally has a thickness of 0.05 to 10 $\mu m$, and preferably has a thickness of 0.1 to 4 $\mu m$. An n-type gallium nitride-based compound semiconductor having a thickness of less than 0.05 tends not to function as a clad layer. On the other hand, when the thickness exceeds 10 $\mu m$, cracks tend to form in the layer.

The second, p-type clad layer 20 normally has a thickness of 0.05 to 1.5 $\mu m$, and preferably has a thickness of 0.1 to 1 $\mu m$. A p-type gallium nitride-based compound semiconductor layer having a thickness less than 0.05 $\mu m$ tends to be hard to function as a clad layer. On the other hand, when the thickness of the layer exceeds 1.5 $\mu m$, the layer tends to be difficult to be converted into a low-resistivity layer.

In the present invention, the light-emitting layer 18 preferably has a thickness within a range such that the light-emitting device of the present invention provides a practical relative light intensity of 90% or more. In more detail, the light-emitting layer 18 preferably has a thickness of 10 Å to 0.5 $\mu m$, and more preferably 0.01 to 0.2 $\mu m$. FIG. 2 is a graph showing a measurement result of the relative light intensities of blue light-emitting diodes each having the structure shown in FIG. 1. Each blue light-emitting diode was prepared by forming the light-emitting layer 18 made of low-resistivity $In_{0.1}Ga_{0.9}N$ while changing the thickness. As is apparent from FIG. 2, when the thickness of the $In_xGa_{1-x}N$ light-emitting layer is 10 Å to 0.5 $\mu m$, the semiconductor device exhibits a practical relative light intensity of 90% or more. The almost same relationship between the thickness and the relative light intensity was obtained for the low-resistivity p-type $In_xGa_{1-x}N$ doped with a p-type impurity, the low-resistivity, n-type $In_xGa_{1-x}N$ doped with at least a p-type impurity, and the n-type $In_xGa_{1-x}N$ doped with an n-type impurity.

Referring back to FIG. 1, the double-heterostructure is normally formed on a substrate 12 through an undoped buffer layer 14.

In the present invention, the substrate 12 can normally be formed of a material such as sapphire, silicon carbide (SiC), or zinc oxide (ZnO), and is most normally formed of sapphire.

In the present invention, the buffer layer 14 can be formed of AlN or a gallium nitride-based compound semiconductor. The buffer layer 14 is preferably formed of $Ga_mAl_{1-m}N$ ($0 < m \leq 1$). The $Ga_mAl_{1-m}N$ allows the formation of a gallium nitride-based compound semiconductor (first clad layer 16) having a better crystallinity thereon than on AlN. As is disclosed in U.S. patent application Ser. No. (U.S. Ser. No.) 07/826,997 filed on Jan. 28, 1992 by Shuji NAKAMURA and assigned to the same assignee, the $Ga_mAl_{1-m}N$ buffer layer is preferably formed at a relatively low temperature of 200° to 900° C., and preferably 400° to 800° C. by the metalorganic chemical vapor deposition (MOCVD) method. The buffer layer 14 preferably has substantially the same semiconductor composition as the first clad layer 16 to be formed thereon.

In the present invention, the buffer layer 14 normally has a thickness of 0.002 $\mu m$ to 0.5 $\mu m$.

In the present invention, the first clad layer 16, the light-emitting layer 18, and the second clad layer 20, all of which constitute the double-heterostructure, can be formed by any suitable method. These layers are preferably sequentially formed on the buffer layer 14 by the MOCVD. The gallium source which can be used for the MOCVD includes trimethylgallium and triethylgallium. The indium source includes trimethylindium and triethylindium. The aluminum source includes trimethylaliminum and triethylaluminum. The nitrogen source includes ammonia and hydrazine. The p-type dopant source includes Group II compounds such as diethylcadmium, dimethylcadmium, cyclopentadienylmagnesium, and diethylzinc. The n-type dopant source includes Group IV compounds such as silane, and Group VI compounds such as hydrogen sulfide and hydrogen selenide.

The gallium nitride-based III-V Group compound semiconductor can be grown in the presence of the p-type impurity source and/or the n-type impurity source by using the above gas source at a temperature of 600° C. or more, and normally 1,200° C. or less. As a carrier gas, hydrogen, nitrogen or the like can be used.

In an as-grown state, the gallium nitride-based III-V Group compound semiconductor doped with a p-type impurity tends to exhibit a high resistivity and have no p-type characteristics (that is, it is not a low-resistivity semiconductor) even if the compound semiconductor contains the p-type impurity. Therefore, as is disclosed in U.S. Ser. No. 07/970,145 filed on Nov. 2, 1992 by Shuji NAKAMURA, Naruhito IWASA, and Masayuki SENOH and assigned to the same assignee, the grown compound semiconductor is preferably annealed at a temperature of 400° C. or more, and preferably 600° C. or more, for preferably one to 20 minutes or more, or the compound semiconductor layer is preferably irradiated with an electron beam while kept heated to a temperature of 600° C. or more. When the compound semiconductor is annealed at such a high temperature that the compound semiconductor may be decomposed, annealing is preferably performed in a compressed nitrogen atmosphere to prevent the decomposition of the compound semiconductor.

When annealing is performed, a p-type impurity in a form bonded with hydrogen, such as Mg—H and Zn—H, is released from the bonds with the hydrogen thermally, and the released hydrogen is discharged from the semiconductor layer. As a result, the doped p-type impurity appropriately functions as an acceptor to convert the high-resistivity semiconductor into a low-resistivity p-type semiconductor. Preferably, the annealing atmosphere does not therefore contain a gas containing hydrogen atoms (e.g., ammonia or hydrogen). Preferred examples of an annealing atmosphere includes nitrogen and argon atmospheres. A nitrogen atmosphere is most preferable.

After the double-heterostructure is formed, as shown in FIG. 1, the second clad layer 20 and the light-emitting layer 18 are partially etched away to expose the first clad layer 16. An n-electrode 24 is formed on the exposed surface, while a p-electrode 26 is formed on the surface of the first clad layer 20. The electrodes 24 and 26 are preferably heat-treated to achieve ohmic contact to the semiconductor layers. Above-described annealing may be achieved by this heat treatment.

The present invention has been generally described above. The first, second, and third embodiments will be individually described below. It should be understood that unique points of the respective embodiments will be particularly pointed out and explained, and the above general description will be applied to these embodiments unless otherwise specified, in the following description.

In the first embodiment of the present invention, low-resistivity $In_xGa_{1-x}N$ constituting the light-emitting layer 18 of the double-heterojunction structure shown in FIG. 1 is of p-type, doped with a p-type impurity. Condition $0<x<0.5$ is preferable to form the light-emitting layer having a good crystallinity and obtain a blue to yellow light-emitting device excellent in the luminosity.

In the first embodiment, the concentration of the p-type impurity doped in $In_xGa_{1-x}N$ of the light-emitting layer 18 should be higher than the electron carrier concentration of a particular, corresponding undoped $In_xGa_{1-x}N$ (The electron carrier concentration of an undoped InGaN varies within a range of about $10^{17}/cm^3$ to $1\times10^{22}/cm^3$, depending on a particular growth condition used). Subject to this condition, the p-type impurity concentration is preferably about $10^{17}/cm^3$ to $1\times10^{21}/cm^3$ from the viewpoint of light emission characteristics of the device. The most preferable p-type impurity is zinc. As described above, the p-type impurity-doped InGaN can be converted into a low-resistivity InGaN by annealing (preferred) or radiating the electron beam.

In the second embodiment of the present invention, the low-resistivity $In_xGa_{1-x}N$ constituting the light-emitting layer 18 of the structure shown in FIG. 1 is of n-type, doped with at least a p-type impurity. Condition $0<x\leq0.5$ is preferable to provide the light-emitting layer having a good crystallinity and obtain a blue to yellow light-emitting device excellent in the luminosity. In the second embodiment, the light-emitting layer should be subjected to the annealing treatment described above, since it contains a p-type impurity.

In the second embodiment, when only a p-type impurity is doped in $In_xGa_{1-x}N$ layer 18, the concentration of the p-type impurity should be lower than the electron concentration of a corresponding undoped $In_xGa_{1-x}N$. Subject to this condition, the p-type impurity concentration is preferably $1\times10^{16}/cm^3$ to $1\times10^{22}/cm^3$ from the viewpoint of the light-emitting characteristics of the device. Especially, when zinc is doped as the p-type impurity at a concentration of $1\times10^{17}/cm^3$ to $1\times10^{21}/cm^3$, and especially $1\times10^{18}/cm^3$ to $1\times10^{20}/cm^3$, the luminosity of the light-emitting device can be further improved and the luminous efficacy can be further increased.

In the second embodiment, the second clad layer 20 is as described above. However, when magnesium is doped as the p-type impurity at a concentration of $1\times10^{18}/cm^3$ to $1\times10^{21}/cm^3$, the luminous efficacy of the light-emitting layer 18 can be further increased.

FIG. 3 is a diagram of the photoluminescence spectrum of a wafer irradiated with a 10-mW laser beam from an He—Cd laser. The wafer was prepared such that a low-resistivity $In_{0.14}Ga_{0.86}N$ layer doped with cadmium (p-type impurity) was formed, according to the second embodiment, on a GaN layer formed on a sapphire substrate. FIG. 4 is a diagram of the photoluminescence spectrum of a wafer prepared following the same procedures except that the $In_{0.14}Ga_{0.86}N$ layer was not doped with cadmium (undoped).

As can be apparent from FIG. 3, the p-type impurity-doped, low-resistivity $In_{0.14}Ga_{0.86}N$ layer of the present invention exhibits strong blue light emission near 480 nm. As can be apparent from FIG. 4, undoped $In_{0.14}Ga_{0.86}N$ layer not doped with a p-type impurity exhibits violet light emission near 400 nm. The same results as in FIG. 3 were obtained when zinc, beryllium, magnesium, calcium, strontium, and/or barium was doped, instead of Cd, according to the present invention. Thus, when the p-type impurity is doped in InGaN according to the present invention, the luminosity is improved.

When the p-type impurity is doped in InGaN, the photoluminescence intensity can be greatly increased as compared to the undoped InGaN. In the device relating to FIG. 3, blue luminescence centers are formed in the InGaN by the p-type impurity, thereby increasing the blue luminescence intensity. FIG. 3 shows this phenomenon. In FIG. 3, a low peak appearing near 400 nm is the inter-band emission peak of the undoped $In_{0.14}Ga_{0.86}N$ and corresponds to the peak in FIG. 4. Therefore, in the case of FIG. 3, the luminous intensity is increased by 20 times or more as compared to FIG. 4.

FIG. 5 is a graph obtained by measuring and plotting the relative light intensities and the Zn concentrations of blue light-emitting devices each having the structure of FIG. 1. Each device was prepared such that the concentration of the p-type impurity Mg of the second clad layer 20 was kept at $1\times10^{20}/cm^3$, while changing the Zn concentration of the p-type impurity Zn-doped $In_{0.1}Ga_{0.9}N$ of the light-emitting layer 18. As shown in FIG. 5, the light-emitting device exhibits a practical relative intensity of 90% or more in the Zn concentration range of $1\times10^{17}/cm^3$ to $1\times10^{21}/cm^3$ and the highest relative light intensity (almost 100%) in the Zn concentration range of $1\times10^{18}/cm^3$ to $1\times10^{20}/cm^3$.

Figure 6:
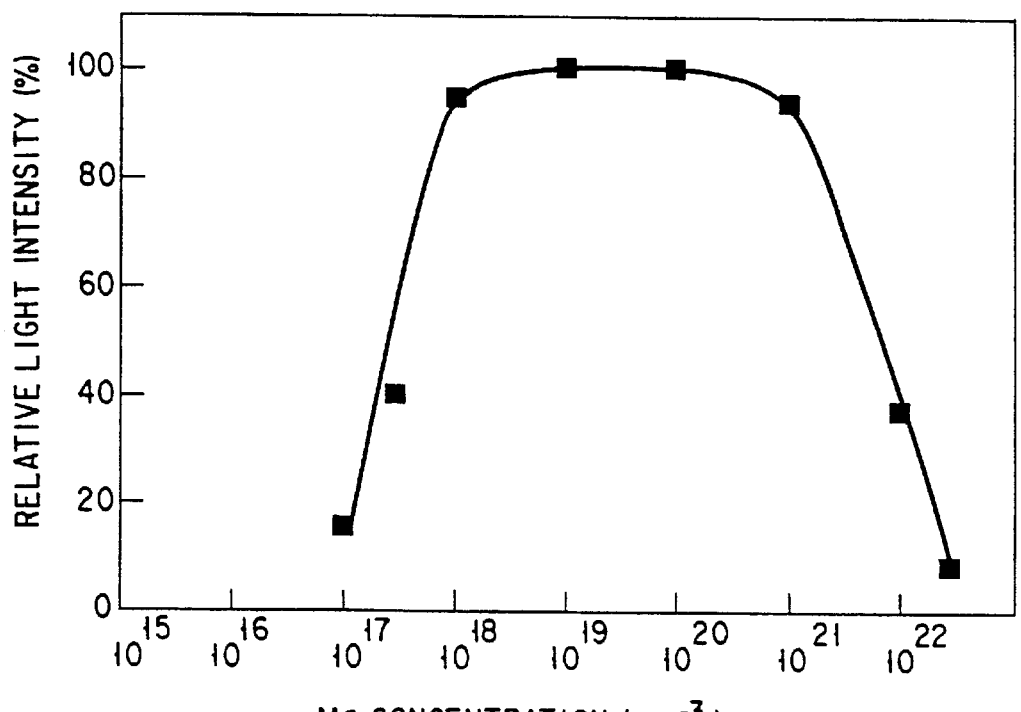
FIG. 6 is a graph showing a relationship between a p-type impurity concentration in a p-type clad layer and the light emission characteristics in the light-emitting semiconductor device according to the second embodiment of the present invention.

FIG. 6 is a graph obtained by measuring and plotting the relative light intensities and the Mg concentrations of blue light-emitting devices each having the structure of FIG. 1. Each device was prepared such that the Zn concentration of the p-type impurity Zn-doped $In_{0.1}Ga_{0.9}N$ of the light-emitting layer 18 was kept at $1\times10^{20}/cm^3$, while changing the concentration of the p-type impurity Mg of the second clad layer 20. As shown in FIG. 6, the light intensity of the light-emitting device tends to rapidly increase when the Mg concentration of the clad layer 20 exceeds $1\times10^{17}/cm^3$, and the light intensity tends to rapidly decrease when the Mg concentration exceeds $1\times10^{21}/cm^3$. FIG. 6 clearly shows that the light-emitting device exhibits a practical relative intensity of 90% or more (almost 100%) when the p-type impurity concentration of the second clad layer 20 is in the range of $1\times10^{18}/cm^3$ to $1\times10^{21}/cm^3$. In FIGS. 5 and 6, the impurity concentrations were measured by a secondary ion mass spectrometer (SIMS).

It is found that, more strictly, the electron carrier concentration in the $In_xGa_{1-x}N$ layer is preferably in the range of $1\times10^{17}/cm^3$ to $5\times10^{21}/cm^3$ when at least a p-type impurity is doped in $In_xGa_{1-x}N$ to form an n-type $In_xGa_{1-x}N$ light-emitting layer having a low resistivity of 10 Ω·cm or less. The electron carrier concentration can be measured by Hall effects measurements. When the electron carrier concentration exceeds $5\times10^{21}/cm^3$, it is difficult to obtain a light-emitting device exhibiting a practical output power. The electron carrier concentration is inversely proportional to the resistivity. When the electron carrier concentration is less than $1\times10^{16}/cm^3$, InGaN tends to be high-resistivity i-type InGaN, and the electron carrier concentration cannot be measured. The impurity to be doped may be only a p-type impurity, or both p- and n-type impurities. More preferably, both p- and n-type impurities are doped. In this case, zinc as the p-type impurity and silicon as the n-type impurity are preferably used. Each of zinc and silicon is preferably doped at a concentration of $1\times10^{17}/cm^3$ to $1\times10^{21}/cm^3$. When the concentration of zinc is lower than that of silicon, InGaN can be converted into preferable n-type InGaN.

When InGaN not doped with an impurity is grown, nitrogen lattice vacancies are created to provide n-type InGaN. The residual electron carrier concentration of this undoped n-type InGaN is about $1\times10^{17}/cm^3$ to $1\times10^{22}/cm^3$ depending on a growth condition used. By doping a p-type impurity serving as a luminescence center in the undoped n-type InGaN layer, the electron carrier concentration in the n-type InGaN layer is decreased. Therefore, when the p-type impurity is doped in InGaN such that the electron carrier concentration is excessively decreased, n-type InGaN is converted into high-resistivity i-type InGaN. When the electron carrier concentration is adjusted to fall within the above range according to the present invention, the output power is increased. This indicates that the p-type impurity serving as the luminescence center performs emission by forming donor-acceptor (D-A) light-emitting pairs with the donor impurity. The detailed mechanism has not been clarified yet. However, it is found that, in the n-type InGaN in which both donor impurity (e.g., the n-type impurity or nitrogen lattice vacancy) for making some electron carriers and the p-type impurity serving as an acceptor impurity are present, the light intensity by the formation of the luminescence centers is apparently increased. Since an increase in the number of light-emitting pairs attributes to an increase in light intensity as described, not only p-type impurity but also n-type impurity is preferably doped in InGaN. More specifically, when the n-type impurity (especially silicon) is doped in InGaN doped with the p-type impurity (especially zinc), the donor concentration is increased, and at the same time, a constant donor concentration with good reproducibility can be obtained, unlike in undoped InGaN in which the electron carrier concentration varies depending on the growth condition as described above, and in which the donor concentration having a constant residual concentration with good reproducibility is hardly obtained. In fact, it is found that, by doping silicon, the electron carrier concentration is increased from about $1\times10^{18}/cm^3$ to $2\times10^{19}/cm^3$ by one figure, and the donor concentration is thus increased. Therefore, the amount of zinc to be doped can be increased by the increased amount of the donor concentration, and accordingly, the number of D-A light-emitting pairs can be increased, thereby increasing the light intensity.

FIG. 7 is a graph obtained by measuring and plotting the relative output powers of blue light-emitting diodes and the electron carrier concentrations in the InGaN layers (measured by Hall effects measurements after growth of the InGaN layer). The blue light-emitting diode was prepared such that an Si-doped n-type GaN layer was grown on the sapphire substrate, a Zn-doped n-type $In_{0.15}Ga_{0.85}N$ layer was grown thereon while changing the Zn concentration, and an Mg-doped p-type GaN layer was grown. The points in FIG. 7 correspond to electron carrier concentrations of $1\times10^{16}$, $1\times10^{17}$, $4\times10^{17}$, $1\times10^{18}$, $1\times10^{19}$, $4\times10^{19}$, $1\times10^{20}$, $3\times10^{20}$, $1\times10^{21}$, and $5\times10^{21}/cm^3$ from the left, respectively.

As shown in FIG. 7, the output power of the light-emitting device changes depending on the electron carrier concentration in the n-type InGaN light-emitting layer. The output power starts to rapidly increase at an electron carrier concentration of about $1\times10^{16}/cm^3$, reaches the maximum level at about $1\times10^{19}/cm^3$, slowly decreases until $5\times10^{21}/cm^3$, and rapidly decreases when the electron carrier concentration exceeds that point. As is apparent from FIG. 7, when the electron carrier concentration in the n-type InGaN layer is in the range of $1\times10^{17}/cm^3$ to $5\times10^{21}/cm^3$, the light-emitting device exhibits an excellent output power.

Figure 8:
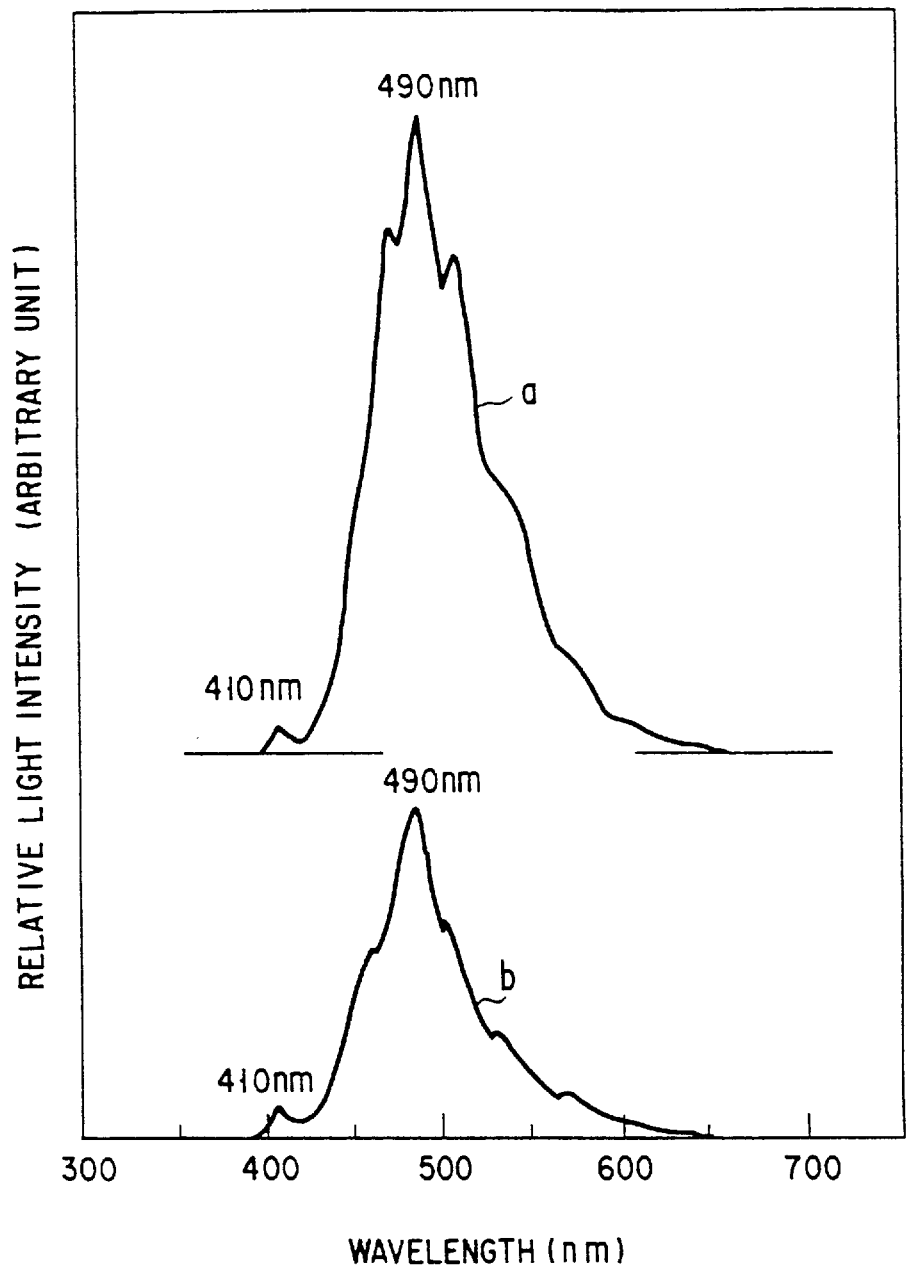
FIG. 8 is a graph showing the light emission characteristics of the light-emitting semiconductor device according to the second embodiment of the present invention.

FIG. 8 shows the light intensity when a laser beam from an He—Cd laser was radiated on the n-type $In_{0.15}Ga_{0.85}N$ layer doped with only zinc at a concentration of $1\times10^{18}/cm^3$, and the n-type $In_{0.15}Ga_{0.85}N$ layer doped with zinc and silicon at concentrations of $1\times10^{19}/cm^3$ and $5\times10^{19}/cm^3$, respectively, and the photoluminescence was measured at room temperature. The measurement result about the n-type $In_{0.15}Ga_{0.85}N$ layer doped with only zinc is represented by a curve a, and the measurement result about the n-type $In_{0.15}Ga_{0.85}N$ layer doped with zinc and silicon is represented by a curve b (in the curve b, measured intensity is reduced to 1/20). Although the both InGaN layers exhibit the major light-emitting peaks at 490 nm, the n-type InGaN layer doped with both zinc and silicon exhibits a light intensity ten times or more that of the n-type InGaN layer doped with only zinc.

In the third embodiment of the present invention, low-resistivity $In_xGa_{1-x}N$ constituting the light-emitting layer 18 of the structure of FIG. 1 is of n-type, doped with only an n-type impurity. Condition $0<x\leq0.5$ is preferable to provide a light-emitting layer semiconductor having a good crystallinity and obtain a blue light-emitting device excellent in the luminosity.

In the third embodiment, the n-type impurity doped in $In_xGa_{1-x}N$ of the light-emitting layer 18 is preferably silicon (Si). The concentration of the n-type impurity is preferably $1\times10^{17}/cm^3$ to $1\times10^{21}/cm^3$ from the viewpoint of the light emission characteristics, and more preferably $1\times10^{18}/cm^3$ to $1\times10^{20}/cm^3$.

In the third embodiment, as in the second embodiment, the second clad layer 20 is as already described above. However, when magnesium is used as the p-type impurity, and is doped at a concentration of $1\times10^{18}/cm^3$ to $1\times10^{21}/cm^3$, the luminous efficacy of the light-emitting layer 18 can be further increased.

FIG. 9 is a graph obtained by measuring and plotting the relative light intensities and the Si concentrations of blue light-emitting devices each having the structure of FIG. 1. Each device was prepared such that the concentration of the p-type impurity Mg of the second clad layer 20 was kept at $1\times10^{19}/cm^3$, while changing the Si concentration of the n-type impurity Si-doped $In_{0.1}Ga_{0.9}N$ of the light-emitting layer 18. As shown in FIG. 9, the light-emitting device exhibits a practical relative intensity of 90% or more in the Si concentration range of $1\times10^{17}/cm^3$ to $1\times10^{21}/cm^3$, and the highest relative light intensity (almost 100%) in the Si concentration range of $1\times10^{18}/cm^3$ to $1\times10^{20}/cm^3$.

FIG. 10 is a graph obtained by measuring and plotting the relative light intensities and the Mg concentrations of blue light-emitting devices each having the structure of FIG. 1. Each device was prepared such that the Si concentration of the n-type impurity Si-doped $In_{0.1}Ga_{0.9}N$ of the light-emitting layer 18 was kept at $1\times10^{19}/cm^3$, while changing the concentration of the p-type impurity Mg of the second clad layer 20. As shown in FIG. 10, the light intensity of the light-emitting device tends to rapidly increase when the Mg concentration of the second p-type clad layer 20 exceeds $1\times10^{17}/cm^3$, and to rapidly decrease when the Mg concentration exceeds $1\times10^{21}/cm^3$. FIG. 10 shows that the light-emitting device exhibits a practical relative intensity of 90% or more (almost 100%) when the p-type impurity concentration of the second clad layer 20 is in the range of $1\times10^{18}/cm^3$ to $1\times10^{21}/cm^3$. In FIGS. 9 and 10, the impurity concentrations were measured by the SIMS.

In the third embodiment, the light-emitting device having the double-heterostructure of the present invention uses inter-band emission of the n-type InGaN layer. For this reason, the half width of the emission peak is as narrow as about 25 nm, which is ½ or less that of the conventional homojunction diode. In addition, the device of the present invention exhibits an output power four times or more that of the homojunction diode. Further, when the value of x of $In_xGa_{1-x}N$ is changed in the range of $0.02<x<0.5$, emission within the wavelength region of about 380 nm to 500 nm can be obtained as desired.

FIG. 11 show a structure of a more practical light-emitting diode 30 having a double-heterostructure of the present invention.

The light-emitting diode 30 a double-heterostructure 22 constituted by an impurity-doped $In_xGa_{1-x}N$ light-emitting layer 18, and two clad layers sandwiching the light-emitting layer 18, i.e., an n-type gallium nitride-based compound semiconductor layer 16 and a p-type gallium nitride-based compound semiconductor layer 20, as described above in detail.

A buffer layer 14 described above in detail is formed on a substrate 20 described above in detail. An n-type GaN layer 32 is formed on the buffer layer 14 to a thickness of, for example, 4 to 5 μm, and provides a contact layer for an n-electrode which is described below. The n-type contact layer 32 allows the formation of a clad layer 16 having a better crystallinity, and can establish a better ohmic contact with the n-electrode.

The double-heterostructure 22 is provided on the n-type contact layer 32, with the clad layer 16 joined to the contact layer 32.

A p-type GaN contact layer 34 is formed on the clad layer 20 to a thickness of, for example, 500 Å to 2 μm. The contact layer 34 establishes a better ohmic contact with a p-electrode described below, and increases the luminous efficacy of the device.

The p-type contact layer 34 and the double-heterostructure 22 are partially etched away to expose the n-type contact layer 32.

A p-electrode is provided on the p-type contact layer 34, and an n-electrode is provided on the exposed surface of the n-type contact layer 32.

The light-emitting diodes embodying the present invention have been described above. However, the present invention should not be limited to these embodiments. The present invention encompasses various types of light-emitting devices including a laser diode, so far as those devices have the double-heterostructures of the present invention.

FIG. 12 shows a structure of a laser diode 40 having a double-heterostructure of the present invention.

The laser diode 40 has a double-heterostructure constituted by an impurity-doped $In_xGa_{1-x}N$ active layer 18 described above in detail in association with the light-emitting diode, and two clad layers sandwiching the active layer 18, i.e., an n-type gallium nitride-based compound semiconductor layer 16 and a p-type gallium nitride-based compound semiconductor layer 20, as described above. A buffer layer 14 described above in detail is formed on a substrate 12 described above in detail. An n-type gallium nitride layer 42 is formed on the buffer layer 14, providing a contact layer for an n-electrode described below.

The double-heterostructure 22 is provided on the n-type gallium nitride contact layer 42, with the clad layer joined to the contact layer 42.

A p-type GaN contact layer 44 is formed on the clad layer 20.

The p-type contact layer 44, the double heterostructure 22 and part of the n-type contact layer 42 are etched away to provide a protruding structure as shown. A p-electrode is formed on the p-type contact layer 44. A pair of n-electrodes 24a and 24b are formed on the n-type GaN layer 42 to oppose each other, with the protruding structure intervening therebetween.

For example, the substrate 12 is a sapphire substrate having a thickness of 100 μm, the buffer layer 14 is a GaN buffer layer having a thickness of 0.02 μm, and the n-type GaN contact layer 42 has a thickness of 4 μm. The first clad layer 16 is an n-type GaAlN clad layer having a thickness of 0.1 μm, the second clad layer 20 is a p-type GaAlN clad layer having a thickness of 0.1 μm, and the active layer 18 is an n-type layer doped with silicon or germanium. The p-type GaN contact layer 44 has a thickness of 0.3 μm.

The present invention will be described below with reference to the following examples. In the examples below, a compound semiconductor was grown by the MOCVD method. An MOCVD apparatus used is a conventional MOCVD apparatus having a structure in which a susceptor for mounting a substrate thereon is arranged in a reaction vessel, and raw material gases can be supplied together with a carrier gas toward a substrate while the substrate is heated, thereby growing a compound semiconductor on the substrate.

EXAMPLE 1

Cleaning of Substrate

First, a sapphire substrate sufficiently washed was mounted on a susceptor in an MOCVD reaction vessel, and the atmosphere in the reaction vessel was sufficiently substituted with hydrogen. Subsequently, while hydrogen was flown, the substrate was heated to 1,050° C., and this temperature was held for 20 minutes, thereby cleaning the sapphire substrate.

Growth of Buffer Layer

The substrate was then cooled down to 510° C. While the substrate temperature was kept at 510° C., ammonia (NH₃) as a nitrogen source, trimethylgallium (TMG) as a gallium source, and hydrogen as a carrier gas were kept supplied at flow rates of 4 liters (L)/min, $27\times10^{-6}$ mol/min, and 2 L/min, respectively, toward the surface of the sapphire substrate for one minute. Thus, a GaN buffer layer having a thickness of about 200 Å was grown on the sapphire substrate.

Growth of First Clad Layer

After the buffer layer was formed, only the supply of TMG was stopped, and the substrate was heated to 1,030° C. While the substrate temperature was kept at 1,030° C., the flow rate of TMG was switched to $54\times10^{-6}$ mol/min, silane gas (SiH₄) as an n-type impurity was added at a flow rate of $2\times10^{-9}$ mol/min, and each material gas was supplied for 60 minutes. Thus, an n-type GaN layer, doped with Si at a concentration of $1\times10^{20}/cm^3$, having a thickness of 4 μm was grown on the GaN buffer layer.

Growth of Light-Emitting Layer

After the first clad layer was formed, the substrate was cooled down to 800° C. while flowing only the carrier gas. While the substrate temperature was kept at 800° C., the carrier gas was switched to nitrogen at a flow rate of 2 L/min, and TMG as a gallium source, trimethylindium (TMI) as an indium source, ammonia as a nitrogen source, and diethylcadmium as a p-type impurity source were supplied at flow rates of $2\times10^{-6}$ mol/min, $1\times10^{-5}$ mol/min, 4 L/min, and $2\times10^{-6}$ mol/min, respectively, for ten minutes. Thus, an n-type $In_{0.14}Ga_{0.86}N$ layer, doped with Cd at a concentration of $1\times10^{20}/cm^3$, having a thickness of 200 Å was grown on the first clad layer.

Growth of Second Clad Layer

After the light-emitting layer was formed, the substrate was heated to 1,020° C. while flowing only the carrier gas nitrogen. While the substrate temperature was kept at 1,020° C., the carrier gas was switched to hydrogen, a gallium source, TMG, a nitrogen source, ammonia, a p-type impurity source, cyclopentadienylmagnesium ($Cp_2Mg$), were supplied at flow rates of $54\times10^{-6}$ mol/min, 4 L/min, $3.6\times10^{-6}$ mol/min, respectively, for 15 minutes. Thus, a p-type GaN layer, doped with Mg at a concentration of $1\times10^{20}/cm^3$, having a thickness of 0.8 $\mu$m was grown on the light-emitting layer.

Conversion into Low-Resistivity Layer

After the second clad layer was grown, the wafer was taken out of the reaction vessel. The wafer was annealed under nitrogen at a temperature of 700° C. or more for 20 minutes. Thus, the second clad layer and the light-emitting layer were converted into low-resistivity layers.

Fabrication of LED

The second clad layer and the light-emitting layer of the wafer obtained above were partially etched away to expose the first clad layer. An ohmic n-electrode was formed on the exposed surface while an ohmic p-electrode was formed on the second clad layer. The wafer was cut into chips each having a size of 500 $\mu m^2$, and a blue light-emitting diode was fabricated by a conventional method.

The blue light-emitting diode exhibited an output power of 300 $\mu$W at 20 mA, and its emission peak wavelength was 480 nm. The luminance of the light-emitting diode measured by a commercially available luminance meter was 50 or more times that of a light-emitting diode of Example 5 to be described later.

EXAMPLE 2

A blue light-emitting diode was prepared following the same procedures as in Example 1 except that, in the growth process of a buffer layer, trimethylaluminum (TMA) was used, instead of TMG, to form an AlN buffer layer on a sapphire substrate at a substrate temperature of 600° C.

The blue light-emitting diode exhibited an output power of 80 $\mu$W at 20 mA, and its emission peak wavelength was 480 nm. The luminance of the light-emitting diode was about 20 times that of a light-emitting diode of Example 5 to be described later.

EXAMPLE 3

Cleaning of a substrate and the growth of a buffer layer were performed following the same procedures as in Example 1.

After the buffer layer was formed, only the TMG flow was stopped, and the substrate was heated to 1,030° C. While the substrate temperature was kept at 1,030° C., and the flow rate of ammonia was not changed, the flow rate of TMG was switched to $54\times10^{-6}$ mol/min, and an aluminum source, TMA, and a p-type impurity source, silane gas ($SiH_4$), were added at flow rates of $6\times10^{-6}$ mol/min and $2\times10^{-9}$ mol/min, respectively, and each gas was supplied for 30 minutes. Thus, an n-type $Ga_{0.9}Al_{0.1}N$ layer (first clad layer), doped with Si at a concentration of $1\times10^{20}/cm^3$, having a thickness of 2 $\mu$m was grown on the GaN buffer layer.

A light-emitting layer was subsequently grown following the same procedures as in Example 1, to form a Cd-doped, n-type $In_{0.14}Ga_{0.86}N$ layer having a thickness of 200 Å.

After the light-emitting layer was formed, supply of all the raw material gases was stopped, and the substrate was heated to 1,020° C. While the substrate temperature was kept at 1,020° C., and the flow rate of the carrier gas was not changed, a gallium source, TMG, an aluminum source, TMA, a nitrogen source, ammonia, and a p-type impurity source, $Cp_2Mg$, were supplied at flow rates of $54\times10^{-6}$ mol/min, $6\times10^{-6}$ mol/min, 4 L/min, and $3.6\times10^{-6}$ mol/min, respectively, for 15 minutes. Thus, a p-type $Ga_{0.9}Al_{0.1}N$ layer (second clad layer), doped with Mg at a concentration of $1\times10^{20}/cm^3$, having a thickness of 0.8 $\mu$m was grown on the light-emitting layer.

The annealing treatment and fabrication of a diode from the wafer were performed following the same procedures as in Example 1, to prepare a blue light-emitting diode.

The blue light-emitting diode obtained above exhibited the same output power, the same emission wavelength, and the same luminance as in the diode of Example 1.

EXAMPLE 4

A blue light-emitting diode was prepared following the same procedures as in Example 1 except that, in the growth process of a light-emitting layer, $Cp_2Mg$ was used instead of diethylcadmium at the same flow rate to grow an Mg-doped, p-type $In_{0.14}Ga_{0.86}N$ light-emitting layer.

The blue light-emitting layer obtained above exhibited the same output power, the same emission wavelength, and the same luminance as in the diode of Example 1.

EXAMPLE 5

A homojunction GaN light-emitting diode was prepared following the same procedures as in Example 1 except that no light-emitting InGaN layer was grown.

The light-emitting diode exhibited an output power of 50 $\mu$W at 20 mA. The emission peak wavelength was 430 nm, and the luminance was 2 milicandela (mcd).

EXAMPLE 6

A blue light-emitting diode was prepared following the same procedures as in Example 1 except that, in the growth process of a light-emitting layer, silane gas at a flow rate of $2\times10^{-9}$ mol/min was used, instead of dimethylcadmium, to form n-type $In_{0.14}Ga_{0.86}N$ light-emitting layer doped with Si at a concentration of $1\times10^{20}/cm^3$.

The light-emitting diode exhibited an output power output of 120 $\mu$W at 20 mA. The emission peak wavelength was 400 nm, and the luminance was about 1/50 that of the diode in Example 1. The low luminance was due to the short wavelength of the emission peak to lower the luminosity.

EXAMPLE 7

Cleaning of a substrate, the growth of a buffer layer, and the growth of a first clad layer (Si-doped, n-type GaN layer) were performed following the same procedures as in Example 1.

After the first clad layer was formed, a light-emitting layer was grown as in Example 1 except that diethylzinc (DEZ) at a flow rate of $1 \times 10^{-6}$ mol/min was used, instead of diethylcadmium, to form an n-type $In_{0.15}Ga_{0.85}N$ layer (light-emitting layer), doped with Zn at a concentration of $1 \times 10^{19}/cm^3$, having a thickness of 200 Å on the first clad layer.

A second clad layer was subsequently grown following the same procedures as in Example 1, to form an Mg-doped, p-type GaN layer having a thickness of 0.8 μm. The annealing treatment and fabrication of a diode from the wafer were performed following the same procedures as in Example 1, to prepare a blue light-emitting diode.

The light-emitting device exhibited an output power of 300 μW at 20 mA. The emission peak wavelength was 480 nm, and the luminance was 400 mcd.

EXAMPLE 8

Cleaning of a substrate and the growth of a buffer layer were performed following the same procedures as in Example 1.

A first clad layer was grown following the same procedures as in Example 3, to form an Si-doped, n-type $Ga_{0.9}Al_{0.1}N$ layer having a thickness of 2 μm.

After the first clad layer was formed, a light-emitting layer was grown as in Example 7, to form an n-type $In_{0.15}Ga_{0.85}N$ layer, doped with Zn at a concentration of $1 \times 10^{19}/cm^3$, having a thickness of 200 Å.

After the light-emitting layer was formed, a second clad layer was grown as in Example 3, to form a p-type $Ga_{0.9}Al_{0.1}N$ layer, doped with Mg at a concentration of $1 \times 10^{20}/cm^3$, having a thickness of 0.8 μm on the light-emitting layer.

The annealing treatment of the second clad layer and fabrication of a diode from the wafer were performed following the same procedures as in Example 1, to prepare a blue light-emitting diode.

The blue light-emitting diode obtained above exhibited the same output power, the same emission peak wavelength, and the same luminance as in the diode of Example 7.

EXAMPLE 9

A blue light-emitting diode was prepared following the same procedures as in Example 7 except that, in the growth process of a light-emitting layer, the flow rate of DEZ was increased, to form an $In_{0.15}Ga_{0.85}N$ light-emitting layer doped with zinc at a concentration of $1 \times 10^{22}/cm^3$.

The blue light-emitting diode thus obtained exhibited an output power of about 40% of that of the diode of Example 7.

EXAMPLE 10

A blue light-emitting diode was prepared following the same procedures as in Example 7 except that, in the growth process of a second clad layer, the flow rate of $Cp_2Mg$ was decreased, to form a p-type GaN layer (second clad layer) doped with Mg at a concentration of $1 \times 10^{17}/cm^3$.

The light-emitting diode exhibited an output power of about 10% of that of the diode of Example 7.

EXAMPLE 11

Cleaning of a substrate, the growth of a buffer layer, and the growth of a first clad layer (Si-doped, n-type GaN layer) were performed following the same procedures as in Example 1.

After the first clad layer was formed, a light-emitting layer was grown as in Example 1 except that diethylzinc was used, instead of diethycadmium, to form a Zn-doped, n-type $In_{0.15}Ga_{0.85}N$ layer having a thickness of 100 Å on the first clad layer. The electron carrier concentration of the n-type $In_{0.15}Ga_{0.85}N$ layer was $1 \times 10^{19}/cm^3$.

A second clad layer was grown following the same procedures as in Example 1, to form an Mg-doped, p-type GaN layer. The annealing treatment and fabrication of a diode from the wafer were performed as in Example 1, to prepare a light emitting diode.

The light-emitting diode exhibited an output power of 400 μW at 20 mA. The emission peak wavelength was 490 nm, and the luminance was 600 mcd.

EXAMPLE 12

A blue light-emitting diode was prepared following the same procedures as in Example 11 except that, in the growth process of a light-emitting layer, the flow rate of DEZ gas was adjusted, to form an n-type $In_{0.15}Ga_{0.85}N$ layer (light-emitting layer) having an electron carrier concentration of $4 \times 10^{17}/cm^3$.

The light-emitting diode exhibited an output power of 40 μW at 20 mA. The emission peak wavelength was 490 nm.

EXAMPLE 13

A blue light-emitting diode was prepared following the same procedures as in Example 11 except that, in the growth process of a light-emitting layer, the flow rate of the DEZ gas was adjusted, to form an n-type $In_{0.15}Ga_{0.85}N$ layer (light-emitting layer) having an electron carrier concentration of $1 \times 10^{21}/cm^3$.

The light-emitting diode exhibited an output power of 40 μW at 20 mA. The emission peak wavelength was 490 nm.

EXAMPLE 14

A blue light-emitting diode was prepared following the same procedures as in Example 11 except that, in the growth process of a light-emitting layer, the flow rate of the DEZ gas was adjusted, to form an n-type $In_{0.15}Ga_{0.85}N$ layer (light-emitting layer) having an electron carrier concentration of $1 \times 10^{17}/cm^3$.

The light-emitting diode exhibited an output power of 4 μW at 20 mA. The emission peak wavelength was 490 nm.

EXAMPLE 15

A blue light-emitting diode was prepared following the same procedures as in Example 11 except that, in the growth process of a light-emitting layer, the flow rate of DEZ gas was adjusted, to form an n-type $In_{0.15}Ga_{0.85}N$ layer having an electron carrier concentration of $5 \times 10^{21}/cm^3$.

The light-emitting diode exhibited an output power of 4 μW at 20 mA. The emission peak wavelength was 490 nm.

EXAMPLE 16

A buffer layer and an n-type GaN layer were formed on a sapphire substrate following the same procedures as in Example 11.

A high-resistivity, i-type GaN layer was grown by using TMG as a gallium source, ammonia as a nitrogen source, and DEZ as a p-type impurity source. The i-type GaN layer was partially etched away to expose the n-type GaN layer. An electrode was formed on the exposed surface, and another electrode was formed on the i-type GaN layer, thereby preparing a light-emitting diode of a MIS structure.

The MIS structure diode exhibited a radiant power output of 1 μW at 20 mA and a luminance of 1 mcd.

EXAMPLE 17

A blue light-emitting diode was prepared following the same procedures as in Example 11 except that, in the growth process of a light-emitting layer, silane gas as an impurity source was added, to form an n-type $In_{0.15}Ga_{0.85}N$ light-emitting layer, doped with Zn and Si, having an electron carrier concentration of $1\times10^{19}/cm^3$.

The light-emitting diode exhibited an output power of 600 μW at 20 mA. The emission peak wavelength was 490 nm, and the luminance was 800 mcd.

EXAMPLE 18

Cleaning of a substrate, the growth of a buffer layer, and the growth of a first clad layer (Si-doped GaN layer) were performed following the same procedures as in Example 1.

After the first clad layer was formed, a light-emitting layer was grown as in Example 1 except that silane and DEZ were used, instead of diethylcadmium, to form an n-type $In_{0.14}Ga_{0.86}N$ layer, doped with Si and Zn, having a thickness of 100 Å on the first clad layer. The light-emitting layer had an electron carrier concentration of $1\times10^{18}/cm^3$.

A second clad layer was grown following the same procedures as in Example 7, to form an Mg-doped (concentration of $2\times10^{20}/cm^3$), p-type GaN layer.

The annealing treatment and fabrication of an LED from the wafer were performed following the same procedures as in Example 1.

The blue light-emitting diode exhibited an output power of 580 μW at 20 mA. The luminance was 780 mcd, and the emission peak wavelength was 490 nm.

EXAMPLE 19

A blue light-emitting diode was prepared following the same procedures as in Example 18 except that, in the growth of a light-emitting layer, the flow rates of the silane gas and the DEZ gas were adjusted, to form an n-type $In_{0.14}Ga_{0.86}N$ light-emitting layer, doped with Si and Zn, having an electron carrier concentration of $1\times10^{20}/cm^3$.

The blue light-emitting diode exhibited an output power of 590 μW at 20 mA. The luminance was 790 mcd, and the emission peak wavelength was 490 nm.

EXAMPLE 20

A blue light-emitting diode was prepared following the same procedures as in Example 18 except that, in the growth process of a light-emitting layer, the flow rates of the silane gas and the DEZ gas were adjusted, to form an n-type $In_{0.14}Ga_{0.86}N$ light-emitting layer, doped with Si and Zn, having an electron carrier concentration of $4\times10^{17}/cm^3$.

The blue light-emitting diode exhibited a radiant power output of 60 μW at 20 mA. The luminance was 80 mcd, and the emission peak wavelength was 490 nm.

EXAMPLE 21

A blue light-emitting diode was prepared following the same procedures as in Example 18 except that, in the growth process of a light-emitting layer, the flow rates of the silane gas and the DEZ gas were adjusted, to form an n-type $In_{0.14}Ga_{0.86}N$ light-emitting layer, doped with Si and Zn, having an electron carrier concentration of $5\times10^{21}/cm^3$.

The blue light-emitting diode exhibited an output power of 6 μW at 20 mA. The luminance was 10 mcd, and the emission peak wavelength was 490 nm.

EXAMPLE 22

A green light-emitting diode was prepared following the same procedures as in Example 18 except that, in the growth process of a light-emitting layer, the flow rate of TMI was adjusted, to form an Si- and Zn-doped $In_{0.25}Ga_{0.75}N$ light-emitting layer.

The green light-emitting layer exhibited an output power of 500 μW at 20 mA. The luminance was 1,000 mcd, and the emission peak wavelength was 510 nm.

EXAMPLE 23

A buffer layer and an n-type GaN layer were formed on a sapphire substrate following the same procedures as in Example 11.

Using TMG as a gallium source, ammonia as a nitrogen source, and silane and DEZ as impurity sources, an i-type GaN layer doped with Si and Zn was formed. The i-type GaN layer was partially etched away to expose the n-type GaN layer. An electrode was formed on the exposed surface, and another electrode was formed on the i-type GaN layer, thereby preparing a light-emitting diode of a MIS structure.

The MIS structure diode exhibited an output power of 1 μW at 20 mA, and a luminance of 1 mcd.

EXAMPLE 24

Cleaning of a substrate, the growth of a buffer layer, and the growth of a first clad layer (Si-doped, n-type GaN layer) were performed following the same procedures as in Example 1.

After the first clad layer was formed, a light-emitting layer was grown as in Example 1 except that an n-type impurity source, silane, was used, instead of diethylcadmium, at an adjusted flow rate, and growth was conducted for 5 minutes, to form an n-type $In_{0.15}Ga_{0.85}N$ light-emitting layer, doped with Si at a concentration of $1\times10^{20}/cm^3$, having a thickness of 100 Å on the first clad layer.

Then, a second clad layer was grown as in Example 1 except that the flow rate of $Cp_2Mg$ was adjusted, to form a p-type GaN layer (second clad layer) doped with Mg at a concentration of $1\times10^{18}/cm^3$. The annealing treatment and fabrication of a diode from the wafer were performed as in Example 1, to prepare a blue light-emitting diode.

The light-emitting diode exhibited an output power of 300 μW at 20 mA. The emission peak wavelength was 405 nm.

EXAMPLE 25

A blue light-emitting diode was prepared following the same procedures as in Example 24 except that, in the growth process of a first clad layer, an Si-doped, n-type $Ga_{0.9}Al_{0.1}N$ layer (first clad layer) having a thickness of 2 fm was formed following the same procedures as in Example 3, and in the growth process of a second clad layer, a p-type $Ga_{0.9}Al_{0.1}N$ layer (second clad layer), doped with Mg at a concentration of $1\times10^{18}/cm^3$, having a thickness of 0.8 μm was formed following the same procedures as in Example 3.

The light-emitting diode exhibited the same output power and the same emission peak wavelength as in the light-emitting diode of Example 24.

EXAMPLE 26

A blue light-emitting diode was prepared following the same procedures as in Example 24 except that, in the growth process of a light-emitting layer, the flow rate of silane gas was increased, to form an n-type $In_{0.15}Ga_{0.85}N$ layer doped with Si at a concentration of $1\times10^{22}/cm^3$.

The output of the light-emitting diode was about 40% of that of the diode of Example 24.

EXAMPLE 27

A blue light-emitting diode was prepared following the same procedures as in Example 24 except that, in the growth process of a second clad layer, the flow rate of $Cp_2Mg$ was decreased, to form a p-type GaN layer doped with Mg at a concentration of $1\times10^{17}/cm^3$.

The output of the light-emitting diode was about 20% of that of the diode of Example 24.

EXAMPLE 28

Cleaning of a substrate and the growth of a buffer layer were performed following the same procedures as in Example 1.

After the buffer layer was formed, only the TMG flow was stopped, and the substrate was heated to 1,030° C. While the substrate temperature was kept at 1,030° C., and the flow rate of ammonia was not changed, the flow rate of TMG was switched to $54\times10^{-6}$ mol/min, an n-type impurity source, silane, was added at a flow rate of $2\times10^{-9}$ mol/min, and the growth was conducted for 60 minutes. Thus, n-type GaN layer (n-type contact layer), doped with Si at a concentration of $1\times10^{20}/cm^3$, having a thickness of 4 μm was formed on the GaN buffer layer.

Then, an aluminum source, TMA, at an adjusted flow rate was added, and the growth was conducted in a similar manner to that in Example 3, to form an Si-doped n-type $Ga_{0.8}Al_{0.2}N$ layer (first clad layer) having a thickness of 0.15 μm on the n-type contact layer.

Next, a light-emitting layer was grown in the same procedures as in Example 17, to form an n-type $In_{0.14}Ga_{0.86}N$ light-emitting layer, doped with Si and Zn, having an electron carrier concentration of $1\times10^{19}/cm^3$ on the first clad layer.

Subsequently, a second clad layer was grown for 2 minutes in a similar manner to that Example 3, to form an Mg-doped $Ga_{0.8}Al_{0.2}N$ layer having a thickness of 0.15 μm on the light-emitting layer.

Then, only the aluminum source flow was stopped, and the growth was conducted for 7 minutes, to form an Mg-doped GaN layer (p-type contact layer) having a thickness of 0.3 μm on the second clad layer.

The annealing treatment was conducted as in Example 1, to convert the light-emitting layer, the second clad layer and the p-type contact layer into low-resistivity layers.

From the wafer, a light-emitting diode having a structure of FIG. 11 was fabricated.

This diode exhibited an output power of 700 μW and a luminance of 1,400 mcd. The emission peak wavelength was 490 nm. The forward voltage was 3.3V at 20 mA. This forward voltage was about 4V lower than that of the diode of Example 3, 8 or 25. This lower forward voltage is due to the better ohmic contact between the GaN contact layers and the electrodes.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A light-emitting gallium nitride-based compound semiconductor device having a double-heterostructure comprising:
   a p-type light-emitting layer having first and second surfaces, and comprising a III-V Group gallium nitride-based compound semiconductor containing gallium, indium and nitrogen, doped with a p-type impurity;
   a first clad layer provided on the side of said first surface of said light-emitting layer, and comprising an n-type gallium nitride-based compound semiconductor;
   a second clad layer provided on the side of said second surface of said light-emitting layer, and comprising a p-type gallium nitride-based compound semiconductor; and
   a p-type contact layer comprising gallium nitride doped with a p-type impurity, and provided on said second clad layer.

2. A light-emitting gallium nitride-based compound semiconductor device having a double-heterostructure comprising:
   a p-type light-emitting layer having first and second surfaces, and comprising a III-V Group gallium nitride-based compound semiconductor containing gallium, indium and nitrogen, doped with a p-type impurity;
   a first clad layer provided on the side of said first surface of said light-emitting layer, and comprising an n-type gallium nitride-based compound semiconductor;
   a second clad layer provided on the side of said second surface of said light-emitting layer, and comprising an p-type gallium nitride-based compound semiconductor; and
   an n-type contact layer comprising gallium nitride doped with an n-type impurity, and provided in electrical contact with said first clad layer.

3. The device according to claim 1 wherein said light-emitting layer comprises a compound semiconductor having a formula: $In_xGa_{1-x}N$, where $0 \leq x \leq 1$.

4. The device according to claim 3, wherein said x is larger than 0 (zero), but smaller than 0.5.

5. The device according to claim 1, wherein said contact layer is doped with magnesium.

6. The device according to claim 1, wherein said first clad layer comprises a semiconductor represented by the formula, $Ga_yAl_{1-y}N$, where $0 \leq y \leq 1$.

7. The device according to claim 1, wherein said second clad layer comprises a semiconductor represented by the formula, $Ga_zAl_{1-z}N$, where $0 \leq z \leq 1$.

8. The device according to claim 7, wherein said second clad layer comprises aluminum, and is doped with magnesium.

* * * * *